(12) United States Patent
Terasaka

(10) Patent No.: US 6,744,638 B2
(45) Date of Patent: Jun. 1, 2004

(54) CONSTRUCTION AND METHOD FOR INTERCONNECTING FLEXIBLE PRINTED CIRCUIT AND WIRING BOARD, LIQUID CRYSTAL DISPLAY DEVICE, AND METHOD FOR MANUFACTURING THE SAME

(75) Inventor: Shinji Terasaka, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 127 days.

(21) Appl. No.: 10/123,586

(22) Filed: Apr. 16, 2002

(65) Prior Publication Data
US 2002/0149921 A1 Oct. 17, 2002

(30) Foreign Application Priority Data
Apr. 16, 2001 (JP) ......................................... 2001-117553

(51) Int. Cl.[7] ................................................. H05K 1/14
(52) U.S. Cl. ........................ 361/803; 361/749; 349/150; 349/152; 257/797; 29/830
(58) Field of Search ................................ 361/749–751, 361/784, 789, 803; 349/150, 152; 439/493; 174/254, 268; 257/730, 797; 29/830, 831

(56) References Cited

U.S. PATENT DOCUMENTS

| | | | | |
|---|---|---|---|---|
| 5,402,255 A | * | 3/1995 | Nakanishi et al. | 349/150 |
| 5,404,239 A | * | 4/1995 | Hirai | 349/150 |
| 5,572,346 A | * | 11/1996 | Sakamoto et al. | 349/150 |
| 5,668,700 A | * | 9/1997 | Tagusa et al. | 361/779 |
| 5,680,191 A | * | 10/1997 | Voisin et al. | 349/150 |
| 5,936,850 A | * | 8/1999 | Takahashi et al. | 361/784 |
| 5,982,468 A | * | 11/1999 | Satou et al. | 349/150 |
| 6,011,599 A | * | 1/2000 | Akada et al. | 349/2 |
| 6,319,019 B1 | * | 11/2001 | Kwon et al. | 439/67 |
| 6,525,718 B1 | * | 2/2003 | Murakami et al. | 345/206 |
| 2001/0040664 A1 | * | 11/2001 | Tajima et al. | 349/150 |

FOREIGN PATENT DOCUMENTS

JP 2730572 B2 12/1997

* cited by examiner

Primary Examiner—John B. Vigushin
(74) Attorney, Agent, or Firm—Choate, Hall & Stewart

(57) ABSTRACT

A wiring board is arranged on the back side of a tape carrier package (TCP), the upper edge of a notch in the leftmost TCP and an outer edge of a branch of the leftmost terminal of the leftmost output terminal portion of the wiring board are arranged on the same plane, the lower edge and the outer edge of the branch are arranged on the same plane, and a terminal and the corresponding terminal of the output terminal portion are superposed on each other without a shift therebetween. Similarly, the upper end of a notch in the rightmost TCP and an outer edge of a branch of the rightmost terminal of the rightmost output terminal portion are arranged on the same plane, the lower edge and the outer edge of the branch are arranged on the same plane, and a terminal and the corresponding terminal of the output terminal portion are superposed on each other without a shift.

13 Claims, 15 Drawing Sheets

1; LCD device

6; wiring board
4; TCP
5; wiring board
3; TCP
2; LCD panel relationship between time and temperature

CONSTRUCTION AND METHOD FOR INTERCONNECTING FLEXIBLE PRINTED CIRCUIT AND WIRING BOARD, LIQUID CRYSTAL DISPLAY DEVICE, AND METHOD FOR MANUFACTURING THE SAME

BACKGROUND OF THE INVENTION

1. Field of the Invention

The invention relates to a construction and a method for interconnecting a flexible printed circuit and a wiring board and a Liquid Crystal Display (LCD) device and method for manufacturing the same and, more particularly to, the construction and the method for interconnecting, for example, a Tape Carrier Package (TCP) and the wiring board and the LCD device with this interconnection construction and the method for manufacturing the same. The present application claims priority of Japanese Patent Application No. 2001-117553 filed on Apr. 16, 2001, which is hereby incorporated by reference.

2. Description of the Related Art

An LCD device is manufactured by a process of filling a gap between a TFT (Thin Film Transistor) board and a CF (Color Filter) board with liquid crystal to form an LCD panel and then connecting to the LCD panel a TCP mounted with a driver IC (Integrated Circuit) for driving the LCD panel and connecting to the TCP a wiring board for supplying a signal and power.

In this process, conventionally, when interconnecting the TCP and the wiring board, for example, they are aligned with each other by superposing alignment markers, one on the other, such alignment holes made in the TCP and the wiring board respectively beforehand or a pit and a spike formed at a predetermined region of an edge of an input terminal portion of the TCP and an output terminal portion of the wiring board respectively.

These alignment hole and pit (spike) used as the alignment markers are, however, formed by a step different from that for forming a circuit pattern, so that an error occurs in a relative position between the alignment markers and the circuit pattern, thus giving rise to misalignment between the TCP and the wiring board.

Further, by such method of using the pit or the spike as the alignment markers, when the pit is formed, there occurs a decrease in area for interconnecting the input terminal portion of the TCP and the output terminal portion of the wiring board; when the spike is formed, on the other hand, there occurs such a defect that when the input terminal portion of the TCP and the output terminal portion of the wiring board are interconnected, the spike may butt against a mating terminal portion, thus damaging it.

To guard against it, for example, Japan Patent No. 2730572 discloses a method by which when a circuit pattern is formed on a TCP and a wiring board, simultaneously a dummy lead and a dummy land are formed as an alignment marker independently of this original circuit pattern so that the dummy lead and the dummy land may be superposed one on the other for alignment of the two.

By this method, specifically, as shown n FIG. 18A, TCPs 102 are connected to an LCD panel 100 and, for example, rightmost and leftmost TCPs 102 are aligned with a wiring board 101 to then connect it to each of the TCPs 102.

The following will describe a configuration of the TCP 102 and that of the wiring board 101.

As Shown in FIG. 18A, in each TCP 102, at a mounting portion of a tape carrier having insulation and flexibility is mounted a driver IC 104 for driving the LCD panel 100.

The tape carrier 103 is made up of a insulated flexible base film (not shown) and such a circuit pattern (not shown) formed thereon as to include an input terminal portion 105 and an output terminal portion 106.

The input terminal portion 105, as shown in FIGS. 18A, 19, and 21, has a plurality of linear terminals $105_1$, $105_2$, ..., $105_n$ (For example, n=384). Outside the outermost terminals $105_1$ and $105_n$ are further formed dummy leads 103a, 103a.

Also, as shown in FIGS. 18A, 12B, 19, and 21, the insulated flexible base film (not shown) is cut at a predetermined region at its both side to form notches 107, 107, in which the dummy leads 103a, 103a are formed so that later described U-shaped dummy lands 113, 113 can be recognized visually.

The notch 107 is specifically formed as a recess so that its upper edge 108 and lower edge 109 may extend perpendicularly to an extension direction (length direction) of linear terminals $105_1$, $105_2$, ..., $105_n$ making up the input terminal portion 105.

The wiring board 101 is, as shown in FIG. 18B, made up of an insulating board 110 and such a circuit pattern formed thereon as to include output terminal portions 111 connected to the input terminal portions 105 of the TCPs 102.

Each of the output terminal portions 111 has n number of terminals $112_1$, $112_2$, ..., $112_n$ that correspond to the input terminal portion 105. Also, as shown in FIGS. 18B, 20 and 22, for example outside the outermost terminal $112_1$ of the leftmost output terminal portion 111 and outside the outermost terminal $112_n$ of the rightmost output terminal portion 111 are formed the U-shaped dummy lands 113, 113.

The following will describe a method of alignment in connecting a wiring board 101 to each TCP 102.

First, an Anisotropic Conductive Film (ACF) is mounted on each output terminal portion 111 of the wiring board 101, which is then arranged on the back side of the TCP 102 in such a manner that each output terminal portion 111 may face the input terminal portion 105 of each TCP 102.

Next, in both of the outermost TCPs 102, the dummy leads 103a are superposed on the vertical portion of the u-shaped dummy lands 113 in alignment perpendicular to the extension direction of the input terminal portion 105 (output terminal portion 111).

Next, as shown in FIGS. 23 and 24, alignment is performed in the extension direction of the input terminal portion 105 so that the U-shaped dummy land 113 may be put in the notch 107, that the upper edge 108 of the notch 107 may be aligned with an outer upper edge 114 of the U-shaped dummy land 113, and that the lower edge 109 of the notch 107 may be aligned with an outer lower edge 115 of the U-shaped dummy land 113.

Next, by using a heat tool, it is performed to heat the TCP 102 and the wiring board 101 to a predetermined temperature under pressure, thus interconnecting the TCP 102 and the wiring board 101.

According to the above-mentioned conventional technology, however, it is necessary to preserve on the TCP 102 a region for providing the dummy leads 103a, 103a besides the terminals $105_1$, $105_2$, ..., $105_n$, thus leading to a problem that the TCP 102 must be widened.

This problem in turn leads to another problem that when a number of TCPs 102 are connected on a high-definition LCD panel having a large number of picture elements, the mutually adjacent ones of these TCPs 102 may interfere with each other in some cases If an inter-terminal pitch is decreased to reduce a width of the TCP 102, on the other hand, there occurs such a problem of short-circuiting, thus deteriorating reliability

SUMMARY OF THE INVENTION

In view of the above, it is an object of the invention to provide a construction and method for interconnecting a TCP and a wiring board and an LCD device and method for manufacturing the same that are capable of accurate alignment and reducing a width of the TCP without deteriorating reliabilities of the interconnection.

According to a first aspect of the present invention, there is provided an interconnecting construction for interconnecting a flexible printed circuit and a wiring board, the flexible printed circuit including: a first circuit pattern forced on one face or two faces of an flexible base film and a semi conductor device mounted at a predetermined region of the insulated flexible base film; and said wiring board including an insulated board on one face or two faces of which is formed a second circuit pattern for receiving a signal or transmitting it to the flexible printed circuit, wherein:

the predetermined region of the insulated flexible base film is formed on the insulated flexible base film so as to face the wiring board, constitutes the first circuit pattern, and is cut to form a notch so that a first alignment portion used for alignment of the flexible printed circuit and the wiring board may be recognized visually therethrough; and based on a positional relationship between the first alignment portion and a second alignment portion that can be visually recognized through the notch, making up the second circuit pattern, and that is used for alignment of the flexible printed circuit and the wiring board, the flexible printed circuit and the wiring board are aligned with each other at least in two different direction therebetween.

In the foregoing first aspect, a preferable mode is one wherein based on a positional relationship between at least part of an edge of the notch and the second alignment portion, the flexible printed circuit and the wiring board are aligned with each other in at least two different directions therebetween.

Also, a preferable mode is ore wherein an input terminal portion or an output terminal portion making up the first circuit pattern and having a plurality of linear input terminals or a plurality of linear output terminals is connected to an output terminal portion or an input terminal portion making up the second circuit pattern and having a plurality of linear input terminals or a plurality of linear output terminals;

the two different directions are an extension direction of the linear input terminals or the linear output terminal portion in the first circuit pattern and a direction intersecting with the extension direction;

the first alignment portion is part of the input terminal portion or the output terminal portion making up the first circuit pattern;

the second alignment portion is part of the output terminal portion or the input terminal portion making up the second circuit pattern and that is connected to the input terminal portion or the output terminal portion respectively making up the first circuit pattern;

the notch has an edge that extends at least in a direction intersecting with the extension direction and the first alignment portion is formed parallel with the extension direction; and the second alignment portion is formed in such a manner that when the input terminal portion or the output terminal portion of the flexible printed circuit and the output terminal portion or the input terminal portion respectively of the wiring board are aligned with each other accurately, one part of the second alignment portion maybe superposed on the first alignment portion and an edge of another part of the second alignment portion may be aligned with the edge of the notch.

In addition, a preferable mode is one wherein the first alignment portion is part of a most peripheral input terminal or a most peripheral output terminal of the flexible printed circuit of the linear input terminals or the linear output terminals in the input terminal portion or the output terminal portion making up the first circuit pattern; and the second alignment portion is part of the linear input terminals or the linear output terminals in the output terminal portion or the input terminal portion making up the second circuit pattern and being connected to a corresponding the linear input terminal or a corresponding the linear output terminal in the first circuit pattern.

Furthermore, a preferable mode is one wherein the first alignment portion and the second alignment portion have respective regions with a same width so as to be superposed on each other, in such a configuration that the linear input terminal or the linear output terminal whose part is formed as the first alignment portion is increased in width at least toward a center side input terminal or a center side output terminal in the flexible printed circuit except at the first alignment portion.

According to a second aspect of the present invention, there is provided a interconnecting method for interconnecting a flexible printed circuit and a wiring board, the flexible printed circuit including: a first circuit pattern formed on one face or two faces of an insulated flexible base film and a semiconductor device mounted at a predetermined region of the insulated flexible base film, and said wiring board including an insulated board on one face or two faces of which is formed a second circuit pattern for receiving a signal or transmitting it to the flexible printed circuit, including the steps of:

forming part of the first circuit pattern formed on such a side of the insulated flexible base film as to face the wiring board as a first alignment portion used in alignment of the flexible printed circuit and the wiring board;

forming part of the second circuit pattern formed on the insulated board as a second alignment portion used in alignment of the flexible printed circuit and the wiring board;

cutting the insulated flexible base film at a predetermined region thereof to form a notch through which the first alignment portion can be recognized visually; and the flexible printed circuit and the wiring board are aligned with each other at least in two different directions therebetween based on a positional relationship between the first alignment portion visually recognized through the notch and the second alignment portion.

In the foregoing second aspect, a preferable mode is one wherein based on a positional relationship between at least part of an edge of the notch and the second alignment portion, the flexible printed circuit and the wiring board are aligned with each other in at least two different directions therebetween.

A preferable mode is one wherein the two different directions are an extension direction of the linear input terminals or the linear output terminal portion in the first circuit pattern and a direction intersecting with the extension direction, and one that wherein includes the steps of:

forming, as the first alignment portion, part of an input terminal portion or an output terminal portion making up the first circuit pattern and having a plurality of linear input terminals or a plurality of linear output terminals;

forming, as the second alignment portion, part of an output terminal portion or an input terminal portion making up the second circuit pattern and having a plurality of linear input terminals or a plurality of linear output terminals.

forming at the notch an edge along the direction intersecting with the extension direction and also forming the first alignment portion in parallel with the extension direction;

forming beforehand the second alignment portion so that when the input terminal portion or the output terminal portion making up the first circuit pattern of the flexible printed circuit and the output terminal portion or the input terminal portion making up the second circuit pattern of the wiring board are aligned with each other accurately along the direction intersecting with the extension direction of the input terminal portion or the output terminal portion making up the first circuit pattern respectively, one part of the second alignment portion and the first alignment portion may be superposed on each other and also an edge of another part of the second alignment portion may be aligned with the edge of the notch; and aligning the first alignment portion and the second alignment portion with each other and then interconnecting the flexible printed circuit and the wiring board.

Still another preferable mode is one that wherein includes the steps of:

forming, as the first alignment portion, cart of a most peripheral terminal of the flexible printed circuit of the input terminals or the output terminals in the input terminal portion or the output terminal portion making up the first circuit pattern; and forming, as the second alignment portion, part of the output terminals or the input terminals in the output terminal portion or the input terminal portion making up the second circuit pattern, so as to be connected to the most peripheral terminal of the first circuit pattern.

An additional preferable mode is one that wherein includes the steps of:

providing the first alignment portion and the second alignment portion with respective regions having a same width so as to be superposed on each other and forming the linear input terminal or the linear output terminal whose part is formed as the first alignment portion so that a width of the terminal may be increased at least toward a center side input terminal or a center side output terminal of the flexible printed circuit except at the first alignment portion; and aligning the first alignment portion and the second alignment portion with each other and then interconnecting the flexible printed circuit and the wiring board.

Still additional preferable mode is one wherein at least a width of the linear input terminal or the linear output terminal whose part is formed as the first alignment portion and a distance between the linear input terminal or the linear output terminal and the adjacent terminal are set beforehand taking into account expansion of the insulated flexible base film when the flexible printed circuit and the wiring board are interconnected.

According to a third aspect of the present invention, there is provided a liquid crystal display device provided with the interconnecting construction according to the first aspect, including;

a liquid crystal display (LCD) panel;

the flexible printed circuit connected to the LCD panel; and the wiring board connected to the flexible printed circuit, wherein the semiconductor device mounted to the flexible printed circuit drives the LCD panel, while the wiring board supplies a signal to the flexible printed circuit.

According to a fourth aspect of the present invention, there is provided a liquid crystal display device manufacturing method including the interconnecting method according to the second aspect, including the step of:

connecting the flexible printed circuit to the LCD panel; and connecting the wiring board to the flexible printed circuit.

With the above configuration, when a flexible printed circuit and a wiring board are interconnected, part of the circuit pattern is used for alignment, thus making it possible to reduce the width of the flexible printed circuit without deteriorating the reliability of the interconnection. It is also possible to give some allowance to the inter-terminal pitch.

In addition, since part of the circuit pattern is used in alignment, alignment can be accurate as compared to a case where an alignment marker is formed in a step different from that for forming the circuit pattern.

Also, since the most peripheral one of the terminals of the input terminal portion of the flexible printed circuit is formed relatively large in width except at a portion used for visual alignment through the notch, it is possible to compensate for a decrease in contact area owing to a shift of this terminal of the flexible printed circuit when the flexible printed circuit and the wiring board are interconnected.

Also, since a width of the terminal whose part is formed as an alignment portion a distance between this terminal the adjacent terminal are set beforehand taking into account expansion of the insulated flexible base film when the flexible printed circuit and the wiring board are interconnected, they can be interconnected accurately to thereby cause, for example, no insufficient interconnection area or no post contact, thus improving reliabilities of the interconnection.

BRIEF DESCRIPTION OF THE DRAWINGS

The above and other objects, advantages, and features of the invention will be more apparent from the following description taken in conjunction with the accompanying drawings, in which.

DETAILED DESCRIPTION OF THE PREFERRED EMBODIMENTS

Figure 1A:
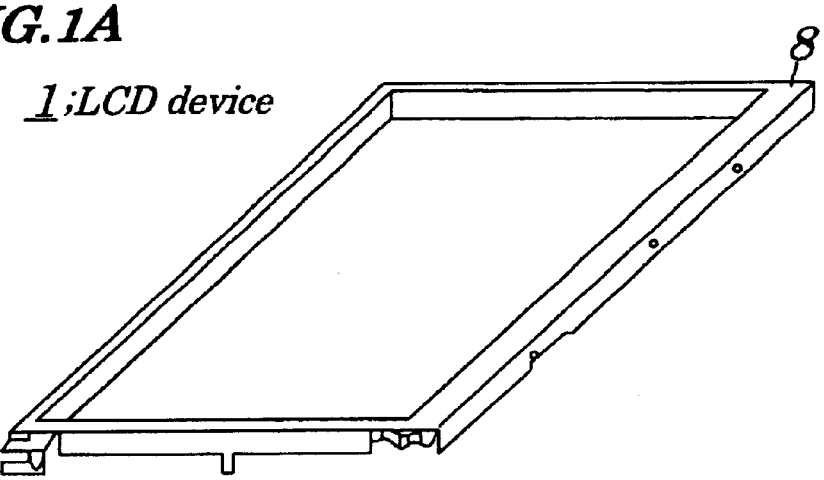
FIGS. 1A, 1B and 1C are exploded schematic diagrams for showing a configuration of an LCD device according to the one embodiment of the present invention.
Figure 1B:
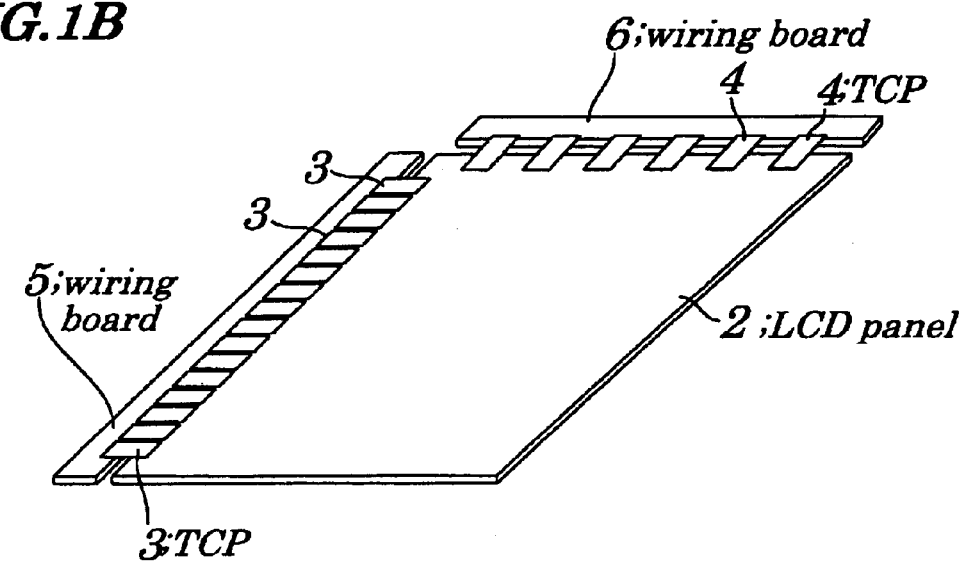
Figure 1C:
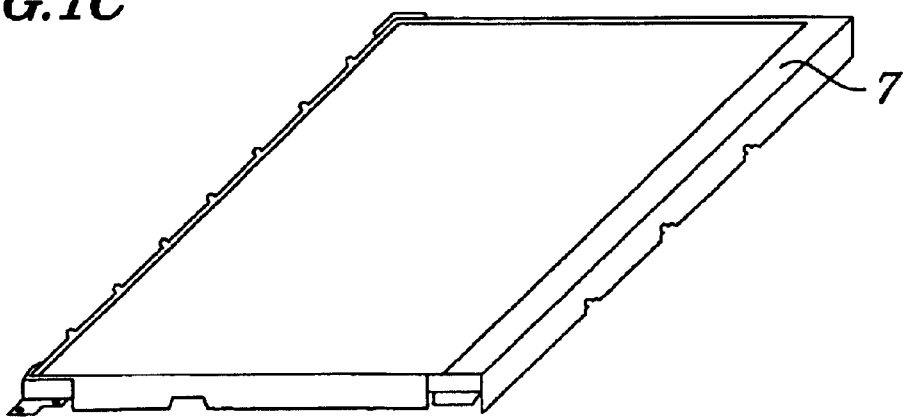

Best modes of carrying out the present invention will be described in further detail using various embodiments with reference to the accompanying drawings.

Modes

First, a construction is described for interconnecting a flexible printed circuit and a wiring board according to a preferable mode of the present invention.

A flexible printed circuit/wiring board interconnection construction according to this anode includes: the flexible printed circuit made of an insulated flexible base film on at least one of both side surfaces of which a first circuit pattern is formed with a semiconductor device mounted at a predetermined region; and the insulated wiring board, as connected with the flexible printed circuit, on at least one of both side surfaces of which is formed a second circuit pattern for receiving a signal from and transmitting it to the flexible printed circuit, in such a configuration that a predetermined region of the insulated flexible base film is cut to form a notch so that a first alignment portion that is formed on such a side of the insulated flexible base film as to face the wiring board and making up the first circuit pattern and can be recognized visually for alignment between the flexible printed circuit on the wiring board, so that the flexible printed circuit and the wiring board are aligned with each other in at least two different directions therebetween based on a positional relationship between the first alignment portion and a second alignment position that can be visually recognized through the notch for alignment between the flexible printed circuit and the wiring board and making up the second circuit pattern.

In this configuration, when the flexible printed circuit and the wiring board are interconnected, part of each of the first and second circuit pattern is used in alignment thereof, thus making it possible to reduce a width of the flexible printed circuit without deteriorating a reliability of interconnection. It is also possible to give an allowance to an inter-terminal pitch.

Moreover, accurate alignment is possible because part of each of the first and second circuit patterns is used for such purpose.

Embodiment

The following will describe a construction and method for interconnecting a TCP and a wiring board and an LCD device and method for manufacturing the same according to one embodiment of the present invention with reference to the drawings.

As shown in FIGS. 1A, 1B, 1C, 2 and 3, an LCD device 1 according to this embodiment includes: an LCD panel 2; TCPs (flexible printed circuits) 3 and TCPs (flexible printed circuits) 4 for driving the LCD panel 2; a wiring board 5 for supplying a signal and power to the TCPs 3; a wiring board 6 for supplying a signal and power to the TCPs 4; a back-light 7 for applying illumination light upward to the LCD panel 2; and a front chassis plate 8 serving as a cabinet for holding a body of the LCD device 1.

In this configuration according to this embodiment, the TCPs 3 and 4 and the wiring boards 5 and 6 (that is, the flexible printed circuits TCPs 3 and 4 and the wiring boards 5 and 6) are interconnected in such a construction that each TCP 3 is aligned with the wiring board 5 at a predetermined position of a notch which is made in the TCP 3 beforehand.

Figure 4:
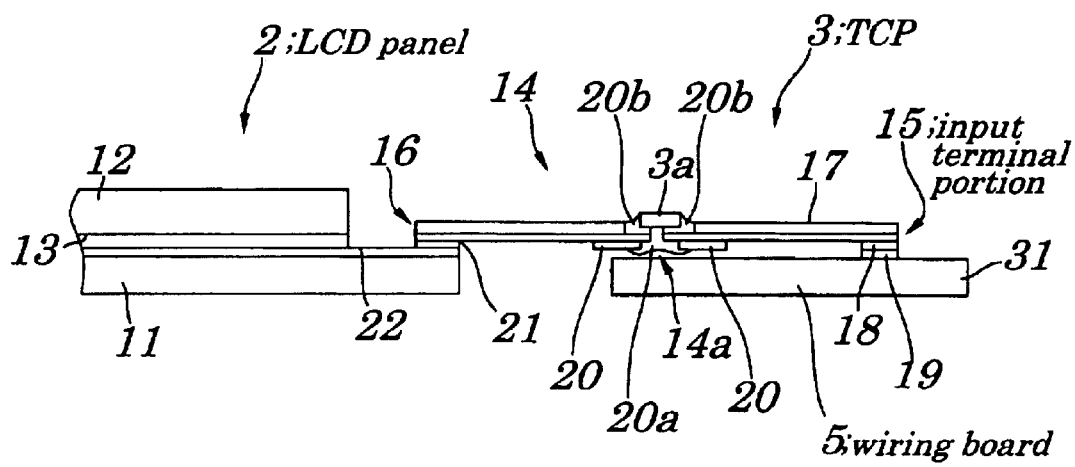
FIG. 4 is a cross-sectional view taken along line A—A of FIG. 3.

The LCD panel 2 is of a transparent-type QXGA (Quad Extended Graphic Array) display having picture elements as many as, for embodiment, 1536×2048×3 (RGB) (Red, Green, and Blue) and includes a TFT board 11, a CF board 12, and a liquid crystal 13 contained therebetween (see FIG. 4).

The TFT board 11 is made up of a transparent glass board (not shown) on which are arrayed signal lines (not shown) and scanning lines (not shown) in a matrix at each intersection of which lines are connected a TFT (not shown) and a picture element electrode (not shown), while the of board 12 is made up of a transparent glass board (not shown) on which are formed a color filter (not shown) and a common electrode (not shown).

Figure 2:
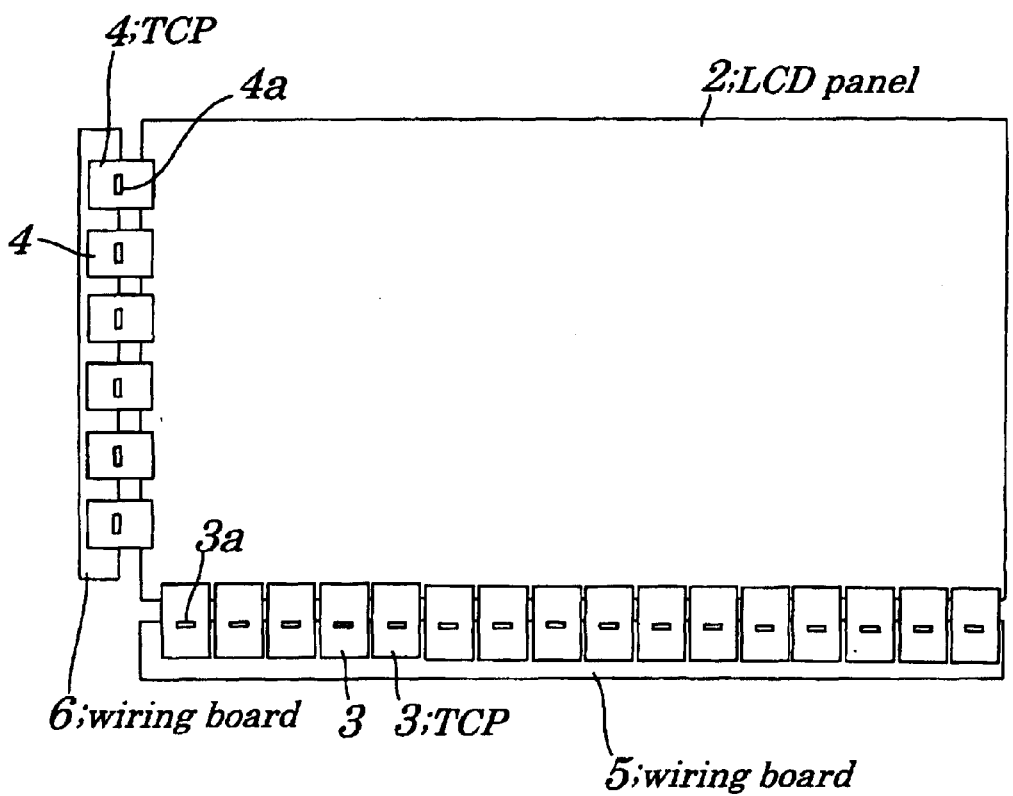
FIG. 2 is a plan view for showing a configuration of an LCD panel of the LCD device of FIG. 1, a TCP, and a wiring board.

In this embodiment, as shown in FIG. 2, one row including 16 pieces of TCPs 3 each having 384 outputs and one column including 6 pieces of TCPs 4 each having 256 outputs is connected with the LCD panel 2.

Figure 3:
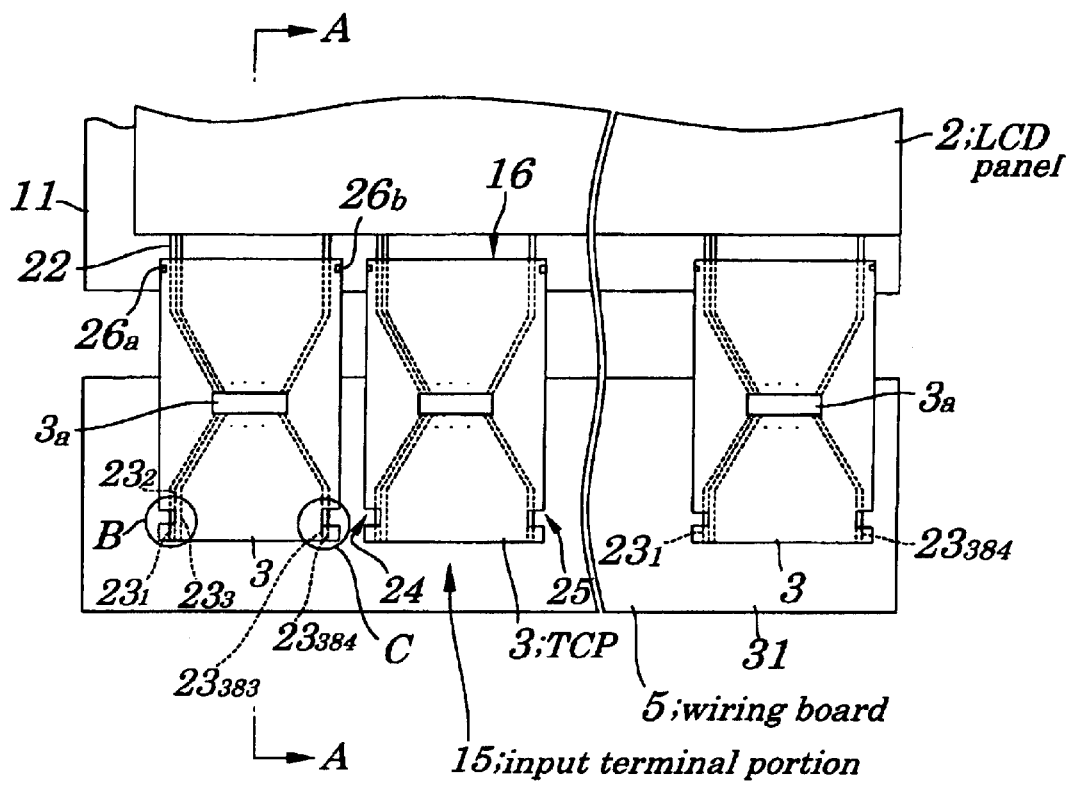
FIG. 3 is a partial plan view for showing a state where a data driver TCP is connected with the LCD panel and the wiring board of FIG. 2.

As shown in FIGS. 3 and 4, each TCP 3 is connected to the wiring board 5 on its input side and to the signal line (not shown) of the LCD panel 2 on its output side and has a data driver IC 3a mounted at a mounting portion 14a of an insulated flexible tape carrier 14 thereof.

As shown in FIGS. 3 and 4, the insulated flexible tape carrier 14 is vertically long rectangle shaped and made up of an insulated flexible base film 17 made of, for example, polyimide, an input terminal portion (part of a first circuit pattern, not shown) 15, and an output terminal portion (part of the first circuit pattern, not shown) 16, which portions are formed of, for in example, copper foil and makes up the circuit pattern (not shown)

As shown in FIGS. 3 and 4, the input terminal portion 15 is connected through a conductive adhesive layer 18 to an output terminal portion 19 of the wiring board 5, while the output terminal portion 16 is connected through a conductive adhesive layer 21 to an external input terminal 22 connected to the signal line of the LCD panel 2.

Note here that a solder resist 20 and a sealing resin 20a and a sealing resin 20b are shown in FIG. 4.

As shown in FIG. 3, the input terminal portion 15 has, for example, 384 terminals $23_1$, $23_2$, . . . , $23_{384}$. An inter-terminal pitch of the input terminal portion 15 is, for example, 300 μm. Also, an inter-terminal pitch of the output terminal portion 16 is, for example, 65 μm.

Figure 5:
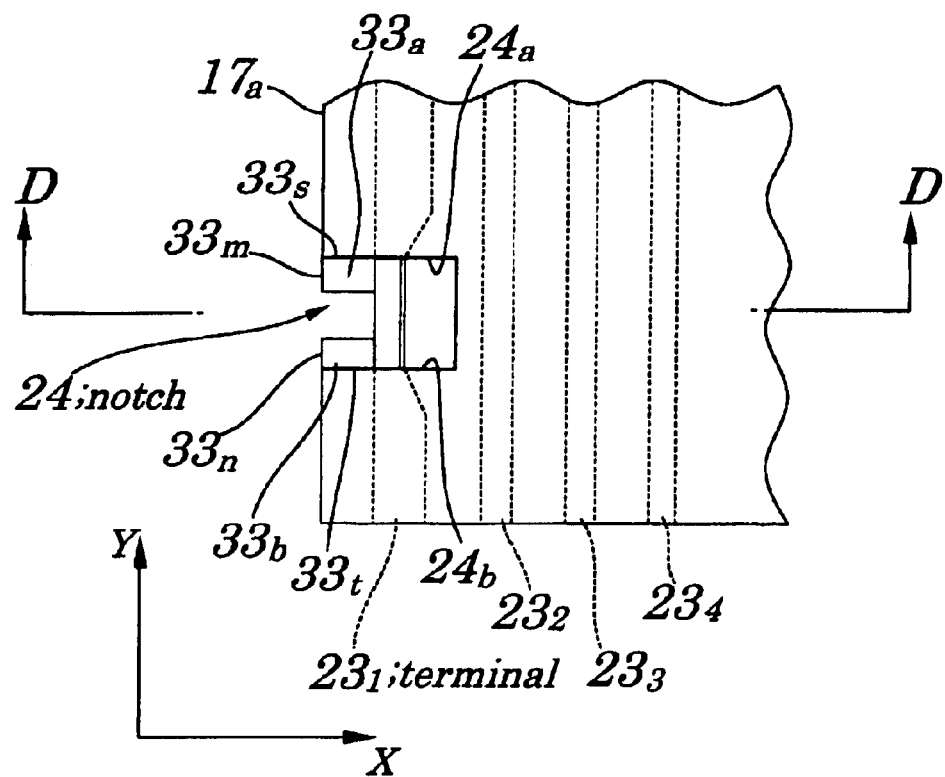
FIG. 5 is an expanded plan view for showing a part "B" of FIG. 3 as expanded.
Figure 7:
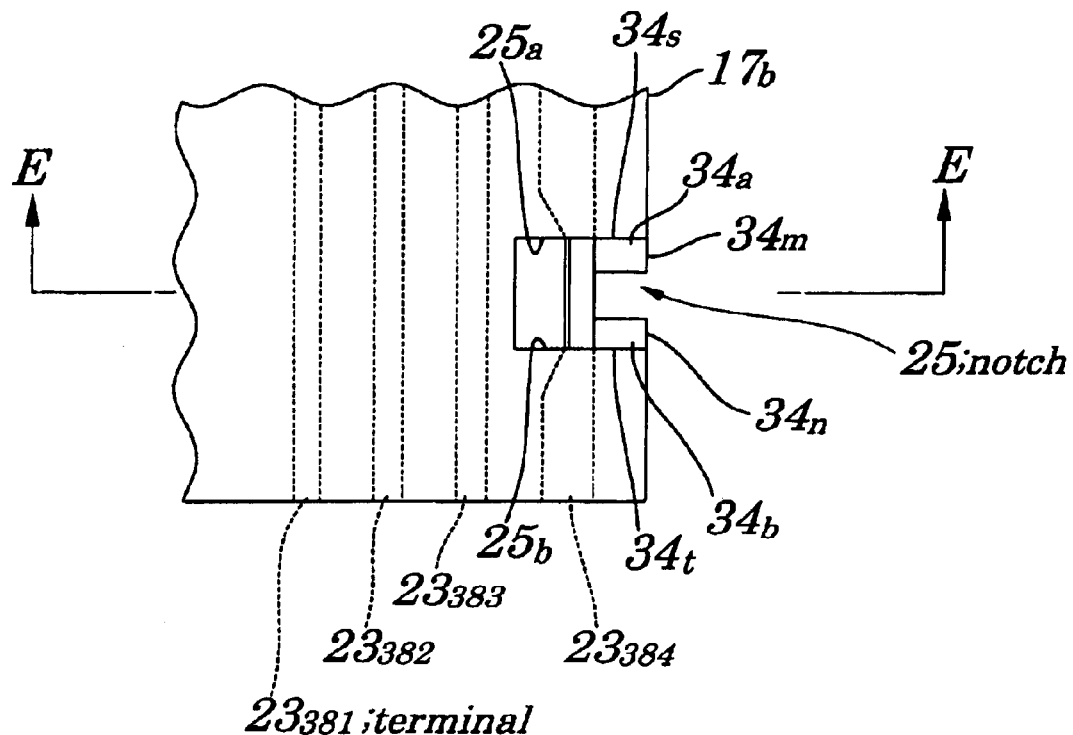
FIG. 7 is an expanded plan view for showing a part "C" of FIG. 3 as expanded.

Also, as shown in FIGS. 3, 5, and 7, the insulated flexible base film 17 is cut at its both sides to form notches 24 and 25 respectively so that the outermost terminals $23_1$ and $23_{384}$ can be recognized visually.

The notches 24 and 25 are formed in a recess in such a manner that upper edges 24a, 25a and lower edges 24b, 25b of the notches 24, 25 may extend in a direction (indicated by an arrow X in FIG. 5) perpendicular to the extension direction (length direction) of the terminals $23_1$ and $23_{384}$.

Also, the TCP 3 has alignment markers 26a and 26b formed at the left and right corners on its side of the output terminal portion 16 for alignment when it is connected to the LCD panel 2.

As shown in FIG. 2, the TCP 4, on the other hand, is connected to the wiring board 6 on its input side and to the scanning line (not shown) of the LCD panel 2 on its output side and has a gate driver IC 4a mounted at the mounting portion (not shown) of the insulated flexible tape carrier (not shown).

In each TCP 4, its input terminal portion (not shown) has an inter-terminal pitch of, for example, 1 mm. Its output terminal portion (not shown) has an inter-terminal pitch of, for example, 100 μm.

As shown in FIGS. 3 and 4, the wiring board 5 is made up of an insulated board 31 made of, or example, glass epoxy and output terminal portions (part of the second circuit pattern) 19 that are formed on the insulated board 31 to make up the circuit pattern and also that are connected to the input terminal portions 15 or the TCPs 3.

Figure 6:
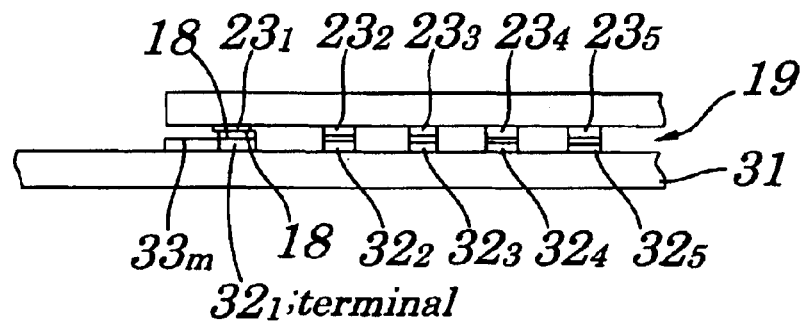
FIG. 6 is a cross-sectional view taken along line D—D of FIG. 5.
Figure 8:
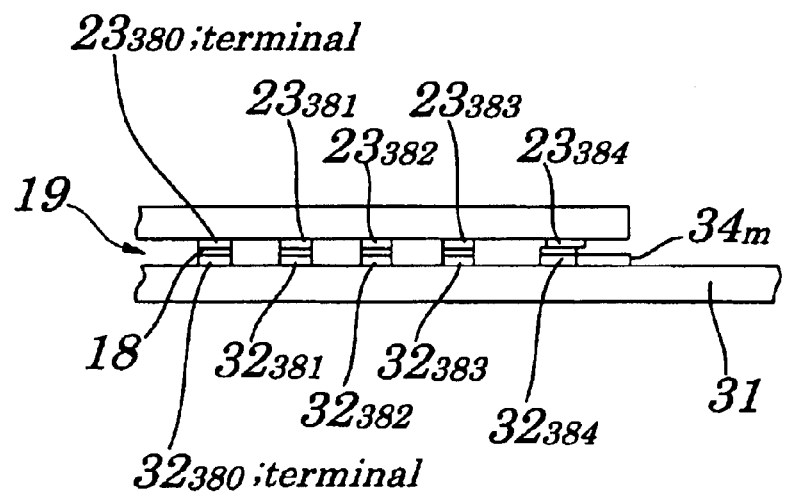
FIG. 8 is a cross-sectional view taken along line E—E of FIG. 7.

As shown in FIGS. 6 and 8, each output terminal portion 19 has, for example, 384 terminals $32_1$, $32_2$, . . . , $32_{384}$ corresponding to the input terminal portion 15.

As shown in FIGS. 5 and 6, the terminal $32_1$ of each output terminal portion 19 on the wiring board 5 spreads into two branches 33a and 33b toward the side of the wiring board 5 in a direction perpendicular to the extension direction (length direction) of the terminal $32_1$.

Note here that tip ends 33s and 33n of the respective branches 33a and 33b are arranged on roughly the same plane as a side end 17b of the insulated flexible base film 17 of the connected TCP 3.

Also note that an outermost ends 33s and 33t of the branches 33a and 33b are arranged on roughly the same plane as the upper edges 24a and 24b of the notch 24.

Also, as shown in FIG. 7, the terminal $32_{384}$ of each output terminal portion 19 on the wiring board 5 spreads into two branches 34a and 34b toward the right side of the wiring board 5 in a direction perpendicular to the extension direction (length direction) of the terminal $32_{384}$.

Note here that tip ends 34m and 34n of the respective branches 34a and 34b are arranged on roughly the same plane as a side end 17b of the insulated flexible base film 17 of the connected TCP 3.

Also note that an outermost ends 34s and 34t of the branches 34a and 34b are arranged on roughly the same plane as the upper edges 25a and 25b of the notch 25.

With the input terminal portion 15 of each TCP 3 and the output terminal portion 19 corresponding to the TCP 3 of the wiring board 5 as interconnected through the conductive adhesive layer 18, the terminal $23_2$ ($23_2$, $23_4$, . . . , $23_{383}$) of the input terminal portion 15 is connected with the terminal $32_2$ ($32_3$, $32_4$, . . . , $32_{383}$) of the output terminal portion 19 as aligned with almost the same pitch therebetween.

Note here that in each TCP 3, the outermost terminals $23_1$ and $23_{384}$ of the input terminal portion 15 are a little shifted toward the edge side of the TCP 3 when it is connected with the outermost terminals $32_1$ and $32_{384}$ of the output terminal portion 19.

The following will describe a method for manufacturing an LCD device 1 according to this embodiment.

Figure 9A:
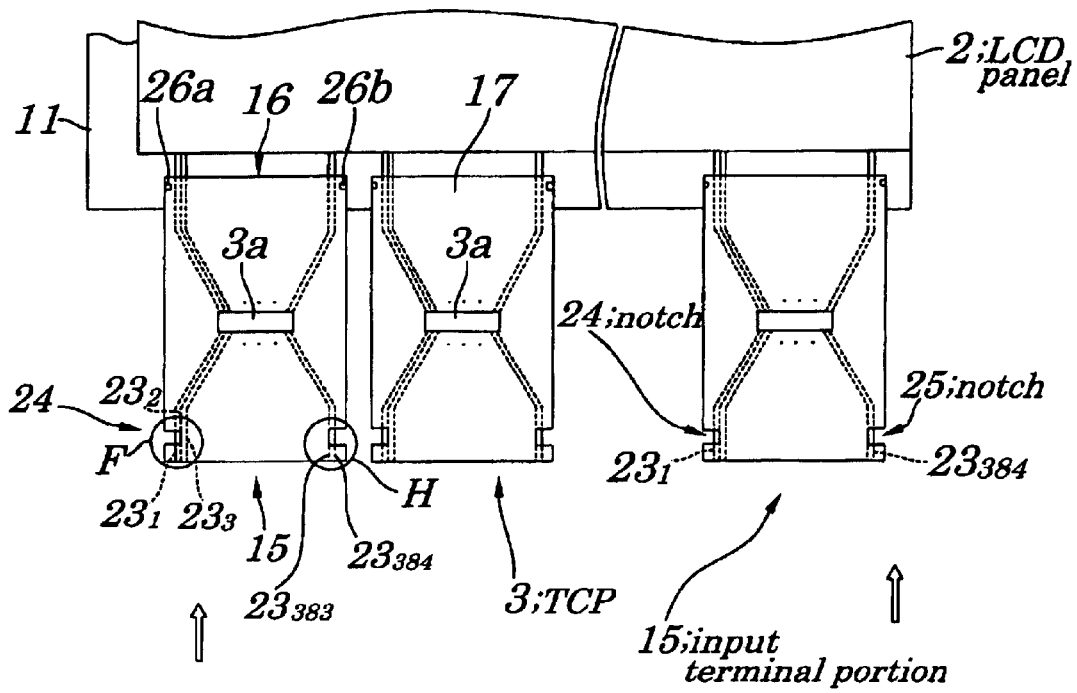
FIGS. 9A and 9B are illustrations for explaining a method of interconnecting the TCP and the wiring board.
Figure 9B:
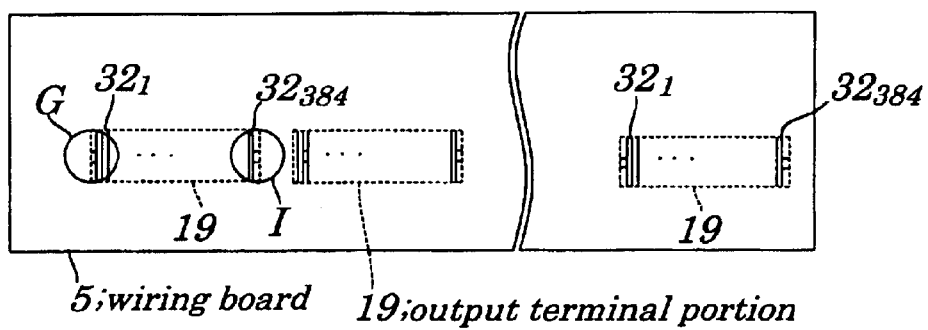

In this embodiment, as shown in FIG. 9A, after each TCP 3 is connected to the LCD panel 2, the wiring board 5 is connected to each TCP 3. Each TCP 3 is connected to the LCD panel 2 specifically by aligning then with each other using the alignment markers 26a and 26b.

Next, how to connect the wiring board 5 to each TCP 3 is detailed as follows.

As shown in FIG. 9A, the TCP 3 is manufactured by performing photo-etching on a copper foil adhered to the insulated flexible base film 17 to thereby form a circuit pattern containing the input terminal portion 15 and the output terminal portion 16 and then mounting a data driver IC 3a at the mounting portion.

In this case, as shown in FIGS. 9A to 13, on the input terminal portion 15, the terminals $23_1$, $23_2$, . . . , $23_{384}$ are formed in parallel with a direction (which is indicated by an arrow X in FIGS. 10 and 12) along the shorter side of the TCP 3 and extend in a direction (which is indicated by an arrow Y in FIGS. 10 and 12) along the longer side of the TCP 3.

Figure 14A:
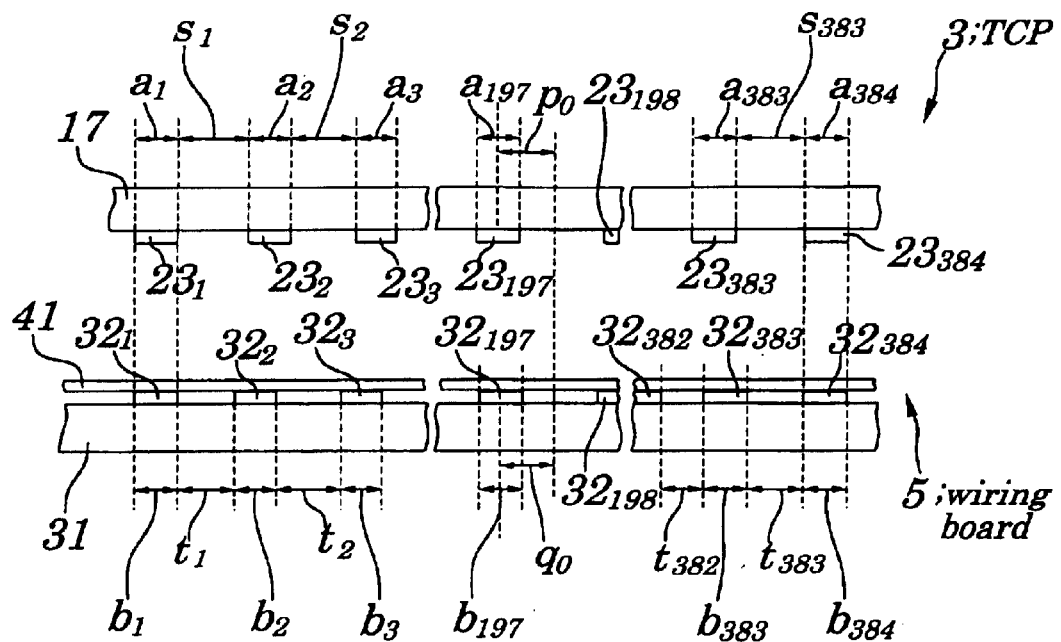
FIGS. 14A and 14B are illustrations for explaining a method of interconnecting the TCP and the wiring board.

Also, as shown in FIG. 14A, widths $a_1$, $a_2$, $a_3$, . . . , $a_{384}$ of the terminals $23_1$, $23_2$, $23_3$, . . . , $23_{384}$ and distances $s_1$, $s_2$, $s_3$, . . . , $s_{384}$ between the terminals $23_1$ and $23_2$, $23_2$ and $23_3$, $23_3$ and $23_4$, . . . , $23_{383}$ and $23_{384}$ are set at predetermined values so that they may be accurately connected to the terminals $32_1$, $32_2$, $32_3$, . . . , $32_{384}$ of the output terminal portion 19 of the wiring board 5 (shown in FIG. 9B) taking into account that the insulated flexible base film 17 will expand during the later processing of heating under pressure.

For example, the distances $s_1$, $s_2$, $s_3$, . . . $s_{384}$ are set at their own predetermined value based on a peak temperature that can be established, a time required to establish this peak temperature, an application pressure of the later described step of heating under pressure, an expansion coefficient of polyimide which the insulated flexible base film 17 is made of, or a like.

Also, the widths $a_1$, $a_2$, $a_3$, $a_{384}$ is set such that the width of a terminal at the periphery may be a little smaller than that at the middle. In this case, the width $a_1$ is set at 0.15 mm.

In the case of the terminals $23_1$, and $23_{384}$, however, widths a01, and a0384 in a region that cannot be recognized visually through the notches 24 and 25 are increased toward the center of the TCP 3 so that a relationship of a01>a1 and a0384>a384 may be established.

After the circuit pattern 5 formed, the insulated flexible base film 17 is cut at a predetermined rectangular region of its both sides to thereby form the recess shaped notches 24 and 25 respectively. By doing so, the terminals $23_1$ and $23_{384}$ can be recognized visually through the notches 24 and 25.

Figure 10:
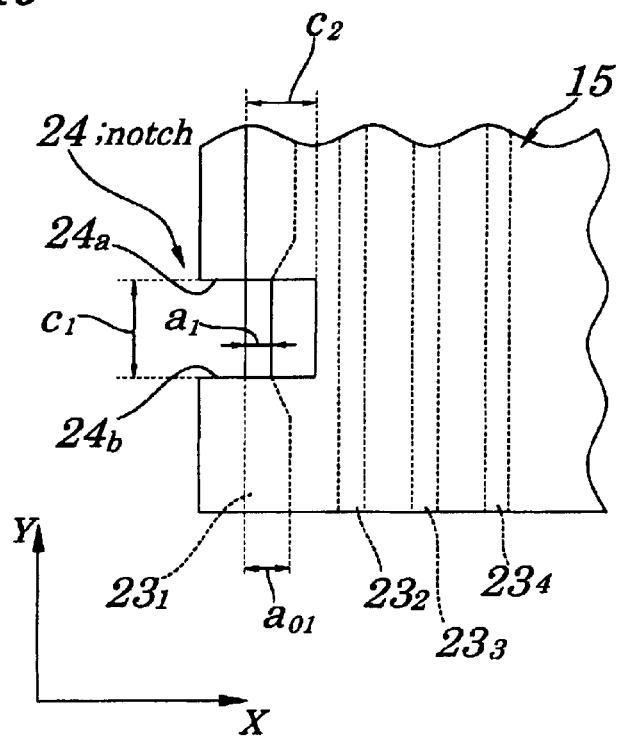
FIG. 10 is an expanded plan view for showing a part "F" FIG. 9A as expanded.
Figure 12:
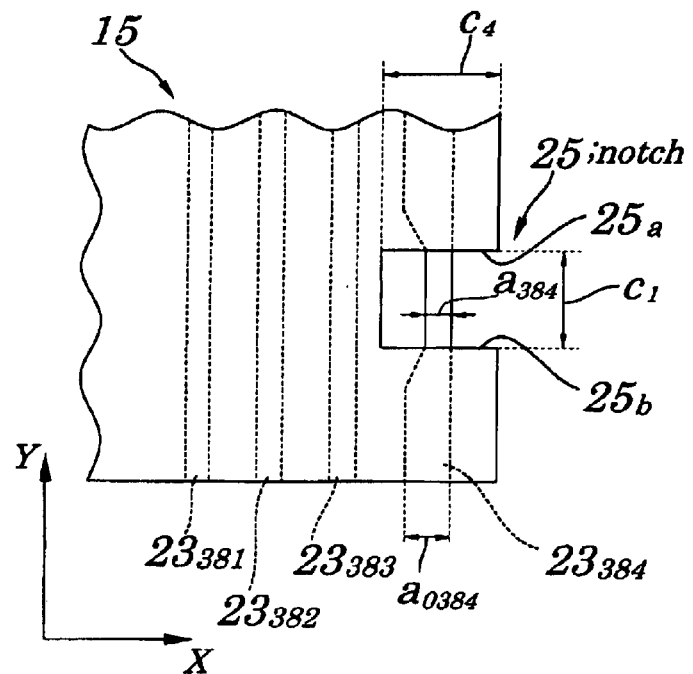
FIG. 12 is an expanded plan view for showing a part "H" of FIG. 9A as expanded.

As shown in FIGS. 10 and 12, the upper edges 24a and 25a and the lower edges 24b and 25b or the notches 24 and 25 extend in such a direction X in which the terminals are arranged in parallel with each other so as to be perpendicular to the extension direction (length direction) Y of the terminals $23_1$, and $23_{384}$.

In this embodiment, distances $c_1$ and $c_3$ between the upper edges 24a and 25a and the lower edges 24b and 25b are about 0.5 mm. Also, lengths $c_2$ and $c_4$ of the upper edges 24a and 25a and the lower edges 24b and 25b are about 0.5 mm.

Figure 11:
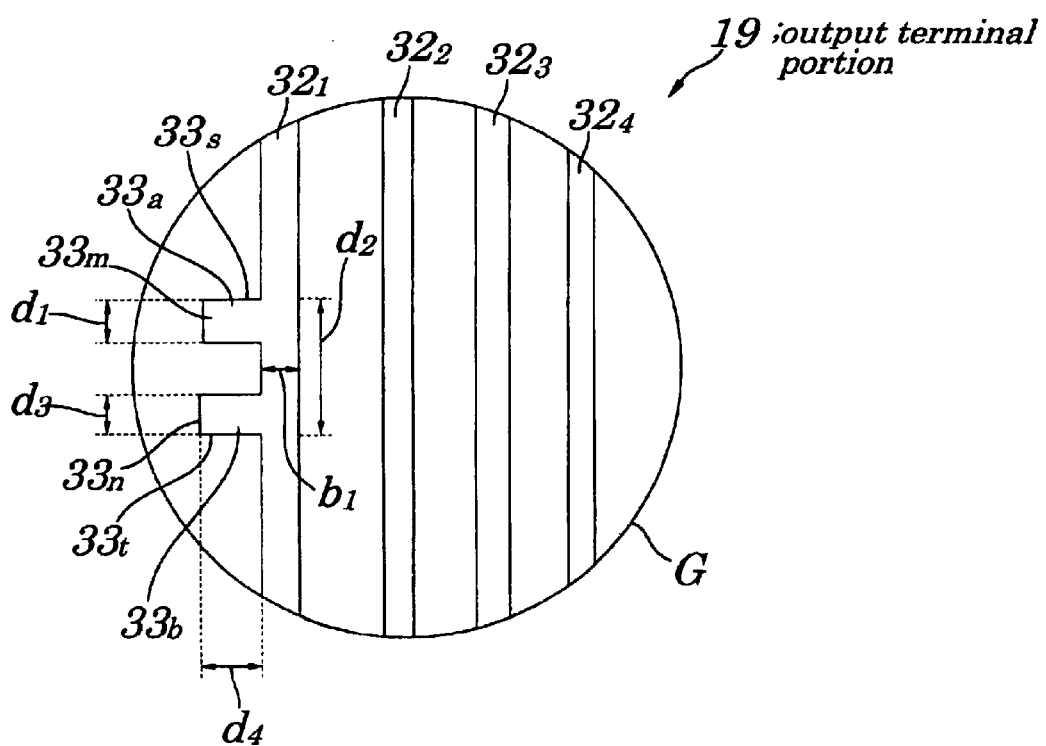
FIG. 11 is an expanded plan view for showing a part "G" of FIG. 9B as expanded.

The wiring board 5 is manufactured by forming a circuit pattern containing the output terminal portion 19 on an insulated board 31 made of, for example, glass epoxy As shown in FIG. 11, the terminal $32_1$ of each output terminal portion 19 of the wiring board 5 spreads into the two branches 33a and 33b toward the side of the wiring board 5 along the parallel arranging direction (terminal width direction) perpendicular to the extension direction (terminal length direction) of the terminal $32_1$.

In this embodiment, widths $d_1$ and $d_3$ of the respective branches 33a and 33b are both set at 0.15 mm, a length $d_4$ of the branches 33a and 33b is set at 0.15 mm, and a distance $d_2$ between an outer edge 33s of the branch 33a and an outer edge 33t of the branch 33b is set at 0.5 mm.

Figure 13:
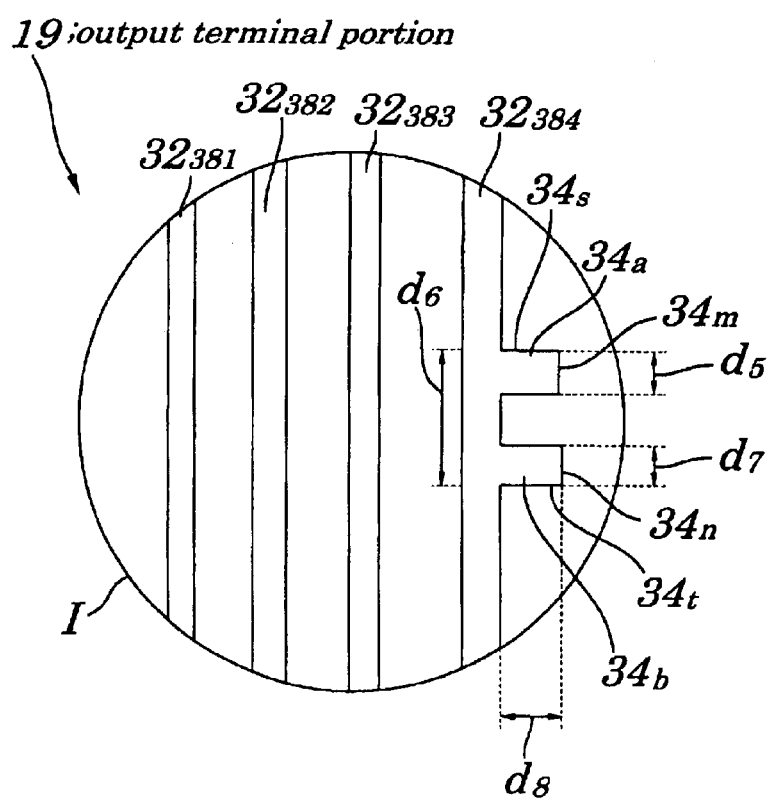
FIG. 13 is an expanded plan view for showing a part "I" of FIG. 9B as expanded.

Also, as shown in FIG. 13, the terminal $32_{384}$ of each output terminal portion 19 of the wiring board 5 spreads into the two branches 34a and 34b toward the side of the wiring board 5 along the parallel arrangement direction (terminal width direction) perpendicular to the extension direction (terminal length direction) of the terminal $32_{384}$.

In this embodiment, widths $d_5$ and $d_7$ of the respective branches 34a and 34b are set at 0.5 mm, a length $d_8$ of the branches 34a and 34b is set at 0.15 mm, a distance $d_6$ between the outer edge 34s of the branch 34a and the outer edge 34t of the branch 34b is set at 0.5 mm.

Also, as shown in FIG. 14A, widths $b_1$, $b_2$, $b_3$, ..., $b_{384}$ of the terminals $32_1$, $32_2$, $32_3$, ..., $32_{384}$ and distances $t_1$, $t_2$, $t_3$, ..., $t_{384}$ between the terminals $32_1$ and $32_2$, $32_2$ and $32_3$, $32_3$ and $32_4$, ..., $32_{383}$ and $32_{384}$ are set at predetermined values so that it may be accurately connected to the terminal $23_1$ of the input terminal portion 15 of the TCP 3.

In this embodiment, the widths $b_1$ and $b_{384}$ are set at 0.15 mm, the same as the widths $a_1$, and $a_{384}$. Also, a distance $q_0$ between the center point of the terminals $32_{197}$ and $32_{198}$ and the centerline of the terminal $32_{197}$ is set to be roughly the same as a distance $p_0$ between the center point of the terminals $23_{197}$ and $23_{198}$ and the centerline of the terminal $23_{197}$.

Also, the widths $a_2$, $a_3$, $a_4$, ..., $a_{384}$ and the widths $b_2$, $b_3$, $b_4$, ..., $b_{383}$ are set so as to establish a relationship of $(a_2/b_2)=(a_3/b_3), ..., =(a_{833}/b_{383})<1$, while the distances $s_2$, $s_3$, $s_4$, ..., $s_{382}$ and the distances $t_2$, $t_3$, $t_4$, ..., $t_{382}$ are set so as to establish a relationship of $(s_2/t_2)=(s_3/t_3)=, ..., =, ..., =(s_{382}/t_{382})<1$.

Next, a step of alignment is performed.

First, as shown in FIG. 14A, an anisotropic conductive film 41 is mounted on the output terminal portion 19 of the wiring board 5, which is in turn mounted on the back side of each TCP 3 in such a manner that each output terminal portion 19 may face the input terminal portion 15 of the TCP 3.

This anisotropic conductive film 41 is manufactured by mixing into a film made of an insulating material a conductive particle with a diameter of about 5 μm made by plating a plastic bead core with nickel or gold, so that when compressed in the thickness direction, it exhibits conductivity only in this thickness direction.

Next, the terminals $23_1$, and $32_1$, are roughly aligned with each other visually through the notch 24 in the leftmost (that is, the nearest the side on which the TCPs 4 of the LCD pane 2 are arranged) TCP 3, while simultaneously the terminals $23_{384}$ and $32_{384}$ are roughly aligned with each other visually through the notch 25 in the rightmost (that is, the most distant from the side on which the TCPs 4 of the LCD panel 2 are arranged) TCP 3.

In this state, the terminal $23_1$ of the leftmost TCP 3 and a region parallel to the extension direction of the terminal $32_1$, (terminal length direction) Y are superposed one on the other accurately as viewed from the above. This completes alignment in the parallel direction (terminal width direction) X.

Also, the upper edge 24a of the notch 24 in the leftmost TCP 3 and the outer edge 33s of the branch 33a of the terminal $32_1$ of the output terminal portion 19 are arranged on the same plane (that is, superposed one on the other as viewed from the above), while simultaneously the lower edge 24b and the outer edge 33t of the branch 33b are arranged on the same plane. This completes alignment in the extension direction (terminal length direction) Y.

At the same time, the terminal $23_{384}$ of the rightmost TCP 3 and a region parallel to the extension direction of the germinal $32_{384}$ (terminal length direction) are superposed one on the other as viewed from the above without a shift therebetween. This completes alignment in the parallel direction (terminal width direction) X.

Also, the upper edge 25a of the notch 25 in the rightmost TCP 3 and the outer edge 34s of the branch 34a of the terminal $32_384$ of the output terminal portion 19 are arranged on the same plane (that is, superposed one on the other as viewed from the above), while simultaneously the lower edge 25b and the outer edge 34t of the branch 34b are arranged on the same plane This completes alignment in the extension direction (terminal length direction) Y.

It is unnecessary to align the portions other than the above-mentioned two outermost portions because the TCPs 3 are aligned on the LCD panel 2 with each other with a pitch of 65 μm therebetween and, therefore, these other portions are automatically aligned with a predetermined accuracy only by aligning the above mentioned two positions.

Next, a step of heating under pressure is performed.

After alignment is completed through the alignment step, a heat tool (not shown) is pressed downward against each TCP 3 with this TCP 3 and the wiring board 5 as sandwiching the anisotropic conductive film 41 therebetween, to thereby heat it under pressure.

Figure 15:
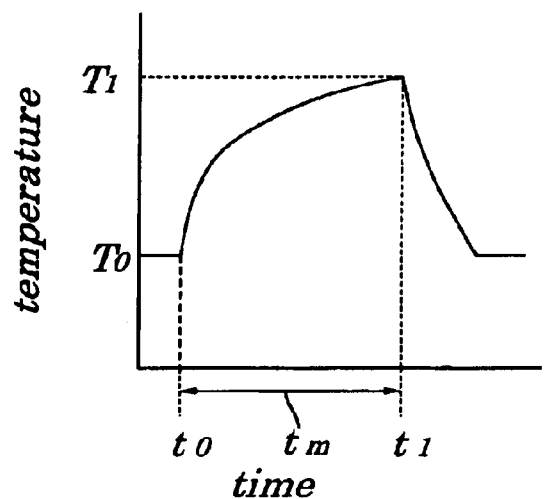
FIG. 15 is a graph for showing a relationship between time and a heating temperature when the TCP and the wiring board are heated under pressure to be interconnected.

In this embodiment, as shown in FIG. 15, it is heated by raising a heating temperature from the room temperature $T_0$ (for example, $T_0=20°$ C.) to the peak temperature that can be established $T_1$ ($T_1 = 180°$ C.) in a time required to establish this peak temperature $t_m$ ($t_m$-$t_1$-$t_0$-20 sec) Also, the application pressure is set at, For example, 30 kg/cm$^2$.

Figure 14B:
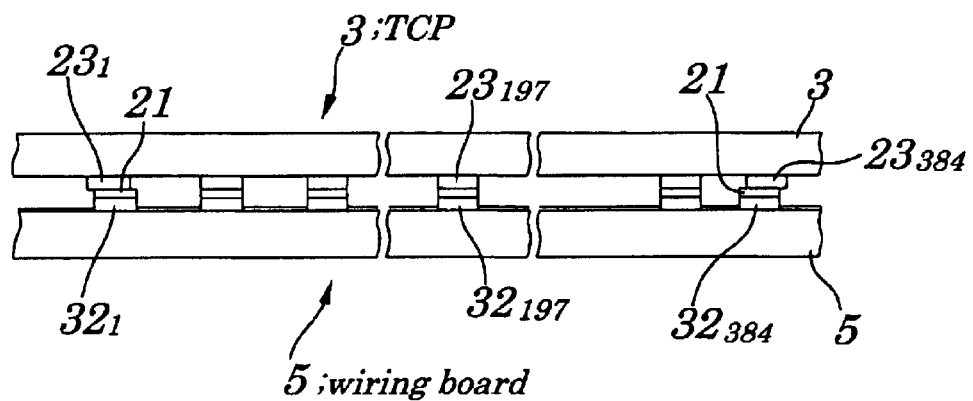

By these steps, as shown in FIG. 14B, each TCP 3 and the wiring board 5 are interconnected with the terminals $23_1$, $23_2$, ..., $23_{384}$ of the input terminal portion 15 of the TCP 3 and the terminals $32_1$, $32_2$, ..., $32_{384}$ of the corresponding output terminal portion 19 of the wiring board 5 as aligned with each other accurately.

As shown in the FIG. 14B, however, the outermost terminals $23_1$ and $23_{384}$ of the input terminal portion 15 of each TCP 3 and the outermost terminals $32_1$ and $32_{384}$ of the output terminal portion 19 are a slightly shifted toward the outside (the peripheral side of the TCP 3), despite which there is provided a sufficient contact area between the terminals $23_1$ and $23_{384}$ and $32_1$ and $32_{384}$ because the widths a01 and a0384 in the region that cannot be recognized visually through the notches 24 and 25 in the terminals $23_1$, and $23_{384}$ is increased in width toward the center of the TCP 3.

Note here that the wiring board 6 is connected to the TCP 4 in the same way as the wiring board 5 is connected to the TCP 3 as mentioned above.

When, the TCPs 3, TCPs 4, and wiring boards 5 and 6 are connected to the LCD panel 2, on which are in turn assembled the back-light 7 and the front chassis plate 8, thus completing the LCD device 1.

By the configuration of this embodiment, part of the circuit pattern is used in alignment, to enable reducing the width of the TCPs 3 and 4 without deteriorating the reliability of the interconnection. Also, some allowance can be given to the inter-terminal patch.

Further, since part of the circuit pattern is thus used for alignment, the components can be aligned with each other more accurately than a method of forming alignment marker and the circuit pattern by different steps.

Also, since the outermost terminals $23_1$ and $23_{384}$ of the input terminal portion 15 are formed relatively large in width except at a portion thereof used for visual alignment through the notch, it is possible to compensate for a decrease in the contact area owing to a shift caused by the step of heating under pressure.

Also, since the width and pitch of the terminals are set taking into account expansion of the material of the insulated flexible base film 17 owing to the heating under pressure, the TCP and the wiring board can be interconnected accurately, thus making it possible to improve the reliability of the interconnection without causing, for example, insufficient interconnection area or poor contact.

It is apparent that the present invention is not limited to the above embodiments but may be changed and modified without departing from the scope and spirit of the invention.

For example, although the above mentioned embodiment has provided the notches 24 and 25 at both sides of each TCP 3 and the branches 33a and 33b and 34a and 34b at the outermost end of each output terminal portion 19, the notches 24 and 25 may be provided only at the right side of the rightmost TCP and the branches 33a and 33b and 34a and 34b may be provided only at the leftmost terminal of the leftmost output terminal portion 19 and at the rightmost terminal of the rightmost output terminal portion 19. By doing so, the TCP width can further be reduced.

Also, although the above-mentioned embodiment has aligned the components only at the two positions where the notches 24 and 25 are formed in the outermost TCP 3, each two portions where the notches 24 and 25 are formed in each TCP 3 may be all used in alignment.

Figure 16:
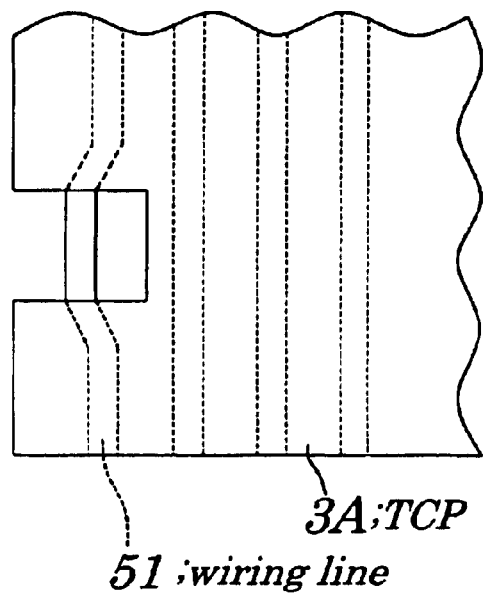
FIG. 16 is a partially expanded plan view for showing a configuration of an important part of a TCP making up a LCD device according to a variant of the embodiment of the present invention.

Also, although the above-mentioned embodiment has formed relatively large the outermost terminals $23_1$ and $23_{384}$ of the input terminal portion except a portion used for visual alignment through the notch, as shown in FIG. 16, the outermost terminal 51 of the input terminal portion may have a constant width even at a portion used for visual alignment through the notch but be shifted toward the center of the TCP 3A.

Figure 17A:
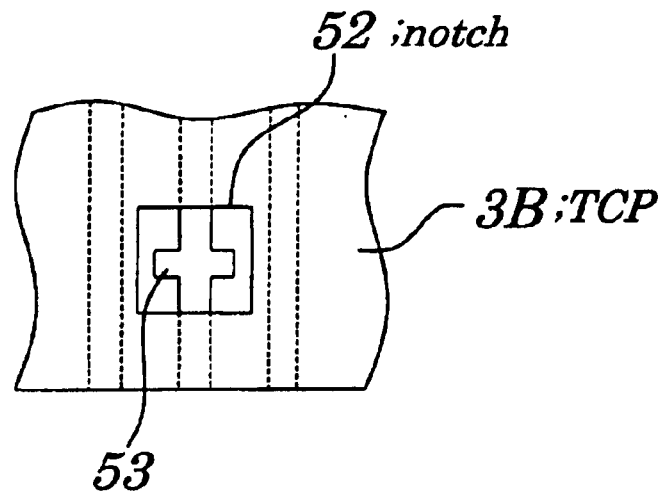
FIGS. 17A and 17B illustration for explaining a construction of interconnection of a TCP and a wiring board making up an LCD device according to another variant of the embodiment of the present invention, FIG. 17A of which is a partially expanded plan view for showing a configuration of an important part of the TCP and FIG. 17B of which is a partially expanded plan view for showing a configuration of an important part of an output terminal portion of the wiring board.
Figure 17B:
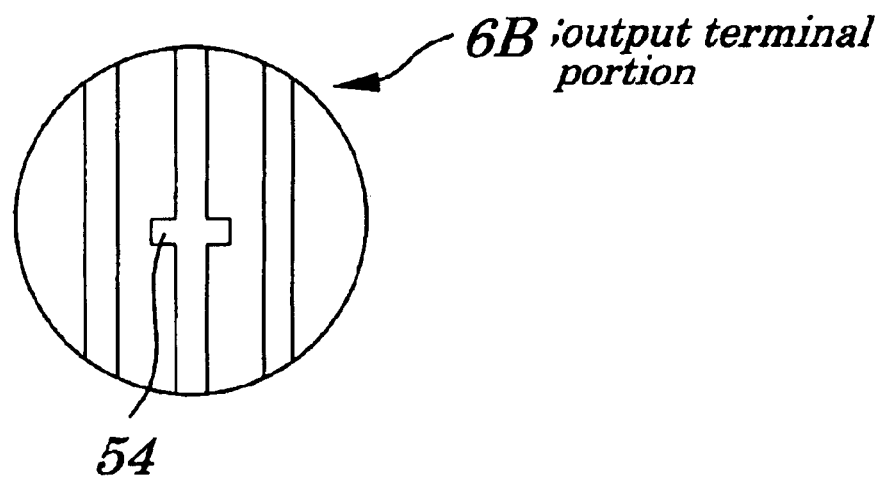
Figure 18A:
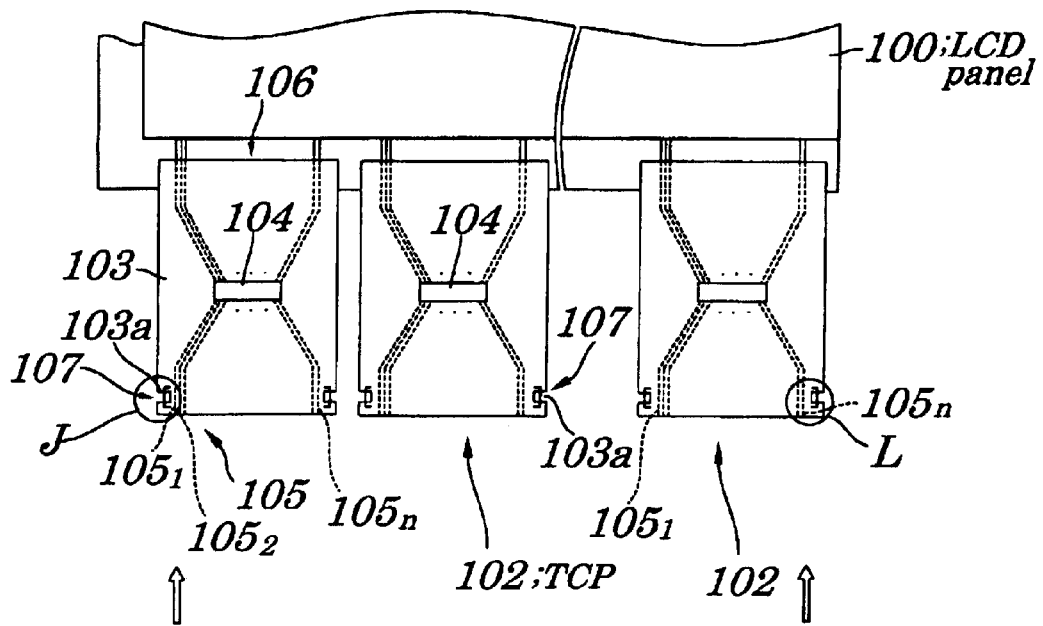
FIGS. 18A and 18B are illustration for explaining a prior art.
Figure 18B:
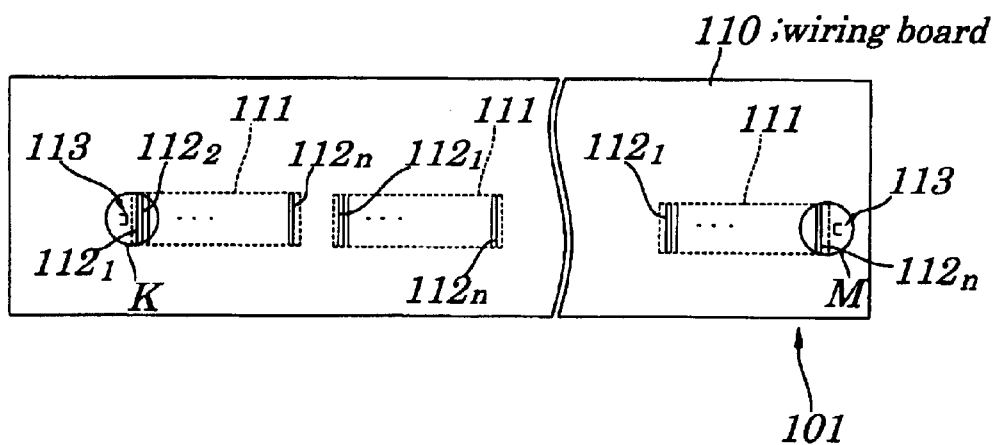
Figure 19:
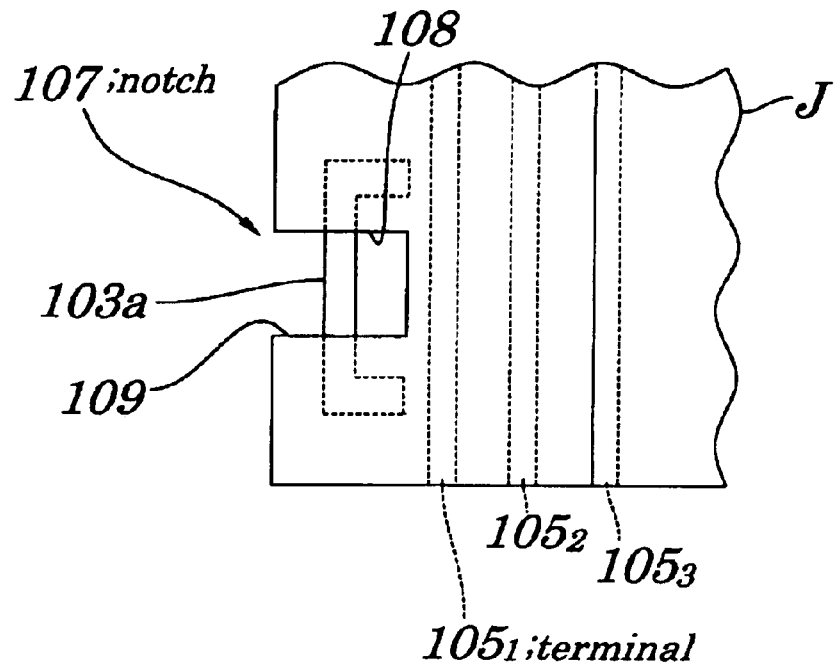
FIG. 19 is an expanded plan view for showing a part "J" of FIG. 18, as expanded, explaining the prior art.
Figure 20:
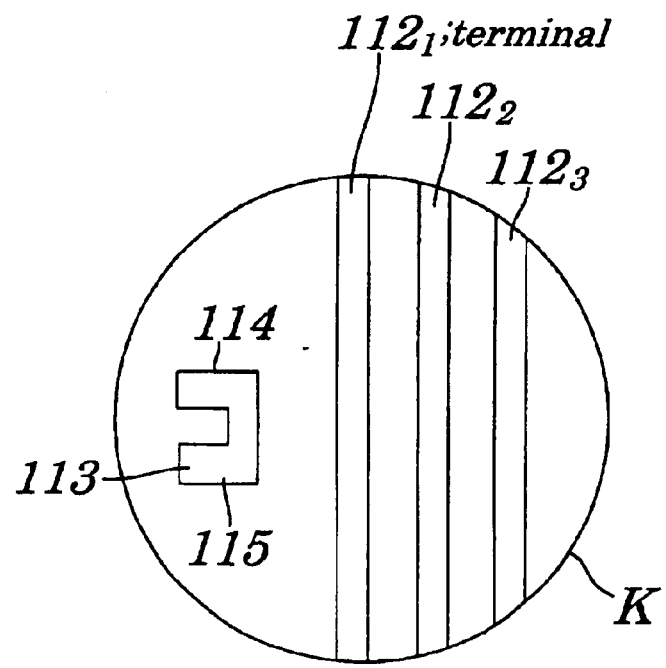
FIG. 20 is an expanded plan view for showing part a "K" of FIG. 18B as expanded, explaining the prior art.
Figure 21:
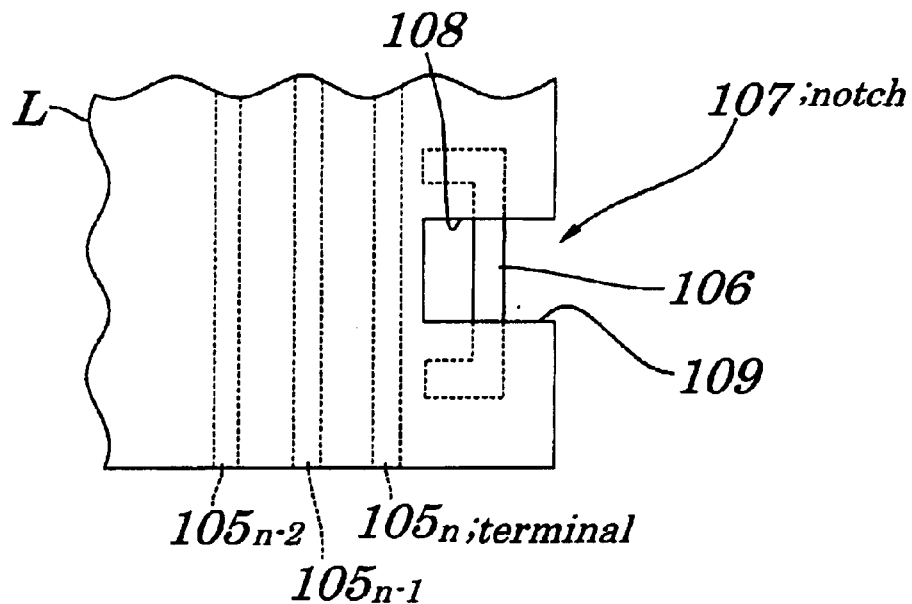
FIG. 21 is an expanded plan view for showing a part "L" of FIG. 18A as expanded, explaining the prior art.
Figure 22:
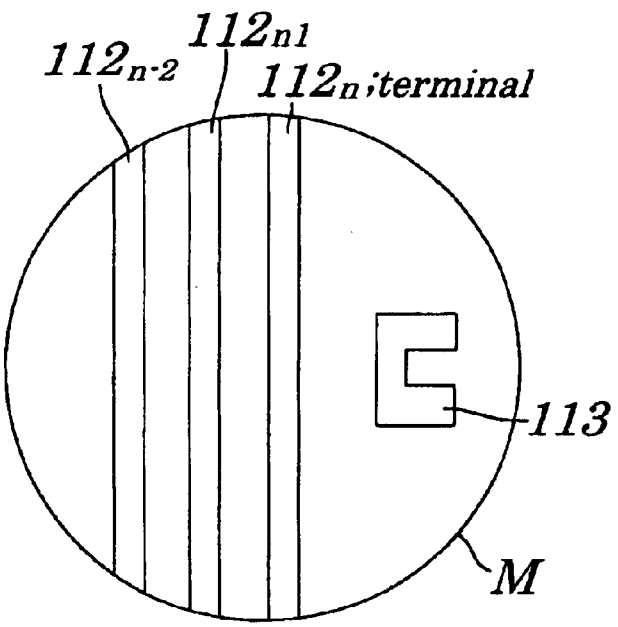
FIG. 22 is an expanded plan view for showing a part "M" of FIG. 18B as expanded, explaining the prior art.
Figure 23:
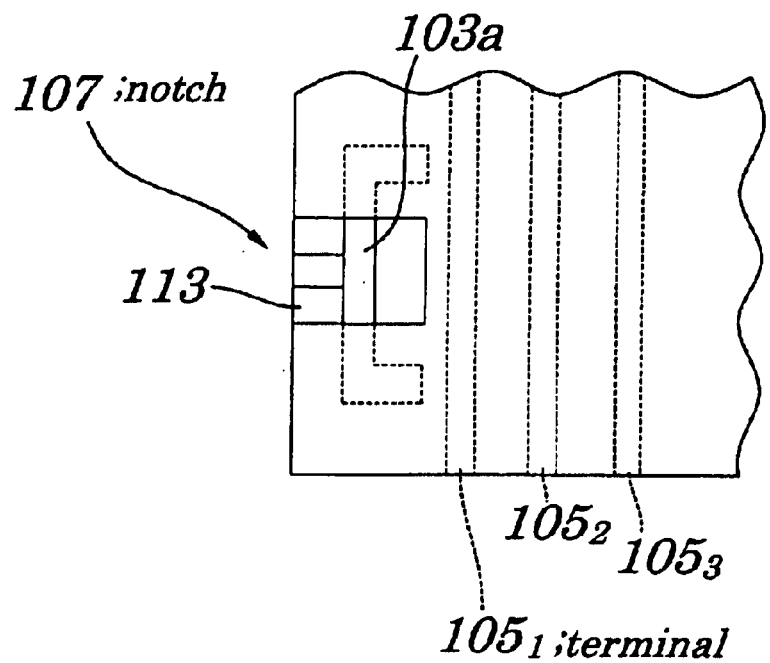
FIG. 23 is another illustration for explaining the prior art.
Figure 24:
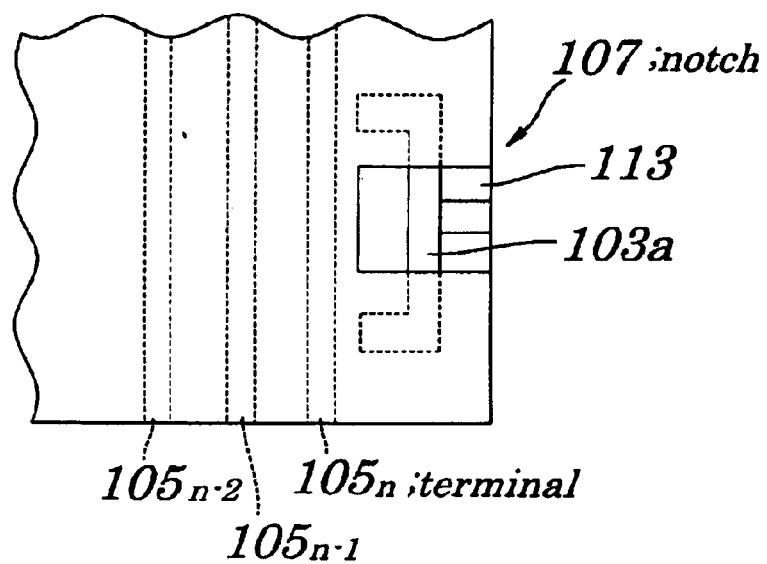
FIG. 24 is still another illustration or explaining the prior art.

Also, the notch may not be formed at both ends on the side of which the TCP 4 is arranged but, as shown in FIG. 17A, a window-shaped notch 52 may be formed at the middle, for example, so that the terminal of the TCP 3B and that of the wiring board may be provided with respective intersections 53 and 54 having the same width and the same length in the extension direction of these terminals for the purpose of alignment.

Also, the notch shape is not limited to a rectangle but may be a circle. Each notch may also be formed in such a manner that a plurality of terminals can be viewed therethrough.

Also, although the above embodiment has been described with reference to a case where the invention is applied to a transparent-type LCD panel, a reflection-type LCD panel may be employed. The liquid crystal may also be of a Twisted Nematic-(TN) type or a Super-Twisted Nematic-(STN) type. Also, the invention is applicable not only to an LCD panel in which the color filter is formed on the opposing board but also to one such that the color filter is formed on the TFT board.

Also, the construction of interconnecting the flexible printed circuit and the wiring board according to the invention is not limited to such a construction that the wiring boards 5 and 6 are connected to the TCP 3 and TCP 4 respectively but may be such that the TCP 3 and TCP 4 are connected to the LCD panel 2.

Further, the construction of interconnecting the flexible printed circuit and the wiring board according to the invention is not limited in application to an LCD device but may well be employed at a portion necessary for accurate alignment.

What is claimed is:

1. An interconnecting construction for interconnecting a flexible printed circuit and a wiring board, said flexible printed circuit comprising:
    a first circuit pattern formed on one face or two faces of an insulated flexible base film and a semiconductor device mounted at a predetermined region of said insulated flexible base film; and said wiring board comprising an insulated board on one face or two faces of which is formed a second circuit pattern for receiving a signal or transmitting it to said flexible printed circuit, wherein:
    said predetermined region of said insulated flexible base film is formed on such a side of said insulated flexible base film as to face said wiring board, constitutes said first circuit pattern, and is cut to form a notch so that at least one alignment portion used for alignment of said flexible printed circuit and said wiring board may be recognized visually therethrough; and based on a positional relationship between at least a part of an edge of said notch and said at least one alignment portion, making up said second circuit pattern, said flexible printed circuit and said wiring board are aligned with each other in at least two different directions therebetween.

2. An interconnecting construction for interconnecting a flexible printed circuit and a wiring board, said flexible printed circuit comprising:

a first circuit pattern formed on one face or two faces of an insulated flexible base film and a semiconductor device mounted at a predetermined region of said insulated flexible base film; and said wiring board comprising an insulated board on one face or two faces of which is formed a second circuit pattern for receiving a signal or transmitting it to said flexible printed circuit, wherein:

said predetermined region of said insulated flexible base film is formed on such a side of said insulated flexible base film as to face said wiring board, constitutes said first circuit pattern, and is cut to form a notch so that a first alignment portion used for alignment of said flexible printed circuit and said wiring board may be recognized visually therethrough;

based on a positional relationship between said first alignment portion and a second alignment portion that can be visually recognized through said notch, making up said second circuit pattern, and that is used for alignment of said flexible printed circuit and said wiring board, said flexible printed circuit and said wiring board are aligned with each other in at least two different directions therebetween; and based on a positional relationship between at least part of an edge of said notch and said second alignment portion, said flexible printed circuit and said wiring board are aligned with each other in at least said two different directions therebetween.

3. The interconnecting construction according to claim 2, wherein:

an input terminal portion or an output terminal portion making up said first circuit pattern and having a plurality of linear input terminals or a plurality of linear output terminals is connected to an output terminal portion or an input terminal portion making up said second circuit pattern and having a plurality of linear input terminals or a plurality of linear output terminals;

said two different directions are an extension direction of said linear input terminals or said linear output terminals in said first circuit pattern and a direction intersecting with said extension direction;

said first alignment portion is part of said input terminal portion or said output terminal portion making up said first circuit pattern;

said second alignment portion is part of said output terminal portion or said input terminal portion making up said second circuit pattern and that is connected to said input terminal portion or said output terminal portion respectively making up said first circuit pattern;

said notch has an edge that extends at least in said direction intersecting with said extension direction and said first alignment portion is formed parallel with said extension direction; and said second alignment portion is formed in such a manner that when said input terminal portion or said output terminal portion of said flexible printed circuit and said output terminal portion or said input terminal portion respectively of said wiring board are aligned with each other accurately, part of said second alignment portion may be superposed on said first alignment portion and an edge of at least part of a remaining part of said second alignment portion may be aligned with said edge of said notch.

4. The interconnecting construction according to claim 3, wherein:

said first alignment portion is part of a most peripheral input terminal or a most peripheral output terminal of said flexible printed circuit of said linear input terminals or said linear output terminals in said input terminal portion or said output terminal portion making up said first circuit pattern; and said second alignment portion is part of said linear input terminals or said linear output terminals in said output terminal portion or said input terminal portion making up said second circuit pattern and being connected to a corresponding said linear input terminal or a corresponding said linear output terminal in said first circuit pattern.

5. The interconnecting construction according to claim 4, wherein said first alignment portion and said second alignment portion have respective regions with a same width so as to be superposed on each other, in such a configuration that said linear input terminal or said linear output terminal whose part is formed as said first alignment portion is increased in width at least toward a center side input terminal or a center side output terminal in said flexible printed circuit except at said first alignment portion.

6. An interconnecting method for interconnecting a flexible printed circuit and a wiring board, said flexible printed circuit comprising:

a first circuit pattern formed on one face or two faces of an insulated flexible base film and a semiconductor device mounted at a predetermined region of said insulated flexible base film; and said wiring board comprising an insulated board on one face or two faces of which is formed a second circuit pattern for receiving a signal or transmitting it to said flexible printed circuit, said interconnecting method comprising the steps of:

forming part of said first circuit pattern formed on said insulated flexible base film so as to face said wiring board;

forming part of said second circuit pattern formed on said insulated board as at least one alignment portion used in alignment of said flexible printed circuit and said wiring board;

cutting said insulated flexible base film at a predetermined region thereof to form a notch through which said at least one alignment portion can be recognized visually; and said flexible printed circuit and said wiring board are aligned with each other at least in two different directions therebetween based on a positional relationship between at least a part of an edge of said notch and said at least one alignment portion.

7. An interconnecting method for interconnecting a flexible printed circuit and a wiring board, said flexible printed circuit comprising a first circuit pattern formed on one face or two faces of an insulated flexible base film and a semiconductor device mounted at a predetermined region of said insulated flexible base film; and said wiring board comprising an insulated board on one face or two faces of which is formed a second circuit pattern for receiving a signal or transmitting it to said flexible printed circuit, said interconnecting method comprising the steps of:

forming part of said first circuit pattern formed on said insulated flexible base film so as to face said wiring board as a first alignment portion used in alignment of said flexible printed circuit and said wiring board;

forming part of said second circuit pattern formed on said insulated board as a second alignment portion used in alignment of said flexible printed circuit and said wiring board;

cutting said insulated flexible base film at a predetermined region thereof to form a notch through which said first alignment portion can be recognized visually; and said flexible printed circuit and said wiring board are aligned with each other at least in two different directions therebetween based on a positional relationship between said first alignment portion visually recognized through said notch and said second alignment portion;

wherein based on a positional relationship between at least part of an edge of said notch and said second alignment portion, said flexible printed circuit and said wiring board are aligned with each other in at least said two different directions therebetween.

8. The interconnecting method according to claim 7, wherein said two different directions are an extension direction of said linear input terminals or said linear output terminals in said first circuit pattern and a direction intersecting with said extension direction, said interconnecting method comprising the steps of:

forming, as said first alignment portion, part of an input terminal portion or an output terminal portion making up said first circuit pattern and having a plurality of linear input terminals or a plurality of linear output terminals;

forming, as said second alignment portion, part of an output terminal portion or an input terminal portion making up said second circuit pattern and having a plurality of linear input terminals or a plurality of linear output terminals;

forming at said notch an edge along said direction intersecting with said extension direction and also forming said first alignment portion in parallel with said extension direction;

forming beforehand said second alignment portion so that when said input terminal portion or said output terminal portion making up said first circuit pattern of said flexible printed circuit and said output terminal portion or said input terminal portion making up said second circuit pattern of said wiring board are aligned with each other accurately along said direction intersecting with said extension direction of said input terminal portion or said output terminal portion making up said first circuit pattern respectively, one part of said second alignment portion and said first alignment portion may be superposed on each other and also an edge of another part of said second alignment portion may be aligned with said edge of said notch; and aligning said first alignment portion and said second alignment portion with each other and then interconnecting said flexible printed circuit and said wiring board.

9. The interconnecting method according to claim 8, comprising the steps of:

forming, as said first alignment portion, part of a most peripheral terminal of said flexible printed circuit of said linear input terminals or said output linear terminals in said input terminal portion or said output terminal portion making up said first circuit pattern; and forming, as said second alignment portion, part of said linear output terminals or said linear input terminals in said output terminal portion or said input terminal portion making up said second circuit pattern, so as to be connected to said most peripheral terminal of said first circuit pattern.

10. The interconnecting method according to claim 9, comprising the steps of:

providing said first alignment portion and said second alignment portion with respective regions having a same width so as to be superposed on each other and forming said linear input terminal or said linear output terminal whose part is formed as said first alignment portion so that a width of said terminal may be increased at least toward a center side input terminal or a center side output terminal of said flexible printed circuit except at said first alignment portion; and aligning said first alignment portion and said second alignment portion with each other and then interconnecting said flexible printed circuit and said wiring board.

11. The interconnecting method according to claim 10, wherein at least a width of said linear input terminal or said linear output terminal whose part is formed as said first alignment portion and a distance between said linear input terminal or said linear output terminal and the adjacent terminal are set beforehand taking into account expansion of said insulated flexible base film when said flexible printed circuit and said wiring board are interconnected.

12. A liquid crystal display device comprising:

a liquid crystal display panel;

a flexible printed circuit connected to said liquid crystal display panel; and a wiring board connected to said flexible printed circuit, wherein a semiconductor device mounted to said flexible printed circuit drives said liquid crystal display panel, while said wiring board supplies a signal to said flexible printed circuit, said liquid crystal display device having interconnecting construction for interconnecting said flexible printed circuit, and said wiring board, said flexible printed circuit comprising:

a first circuit pattern formed on one face or two faces of an insulated flexible base film and said semiconductor device mounted at a predetermined region of said insulated flexible base film; and said wiring board comprising an insulated board on one face or two faces of which is formed a second circuit pattern for receiving a signal or transmitting it to said flexible printed circuit, wherein:

said predetermined region of said insulated flexible base film is formed on such a side of said insulated flexible base film as to face said wiring board, constitutes said first circuit pattern, and is cut to form a notch so that a first alignment portion used for alignment of said flexible printed circuit and said wiring board may be recognized visually therethrough;

based on a positional relationship between said first alignment portion and a second alignment portion that can be visually recognized through said notch, making up said second circuit pattern, and that is used for alignment of said flexible printed circuit and said wiring board, said flexible printed circuit and said wiring board are aligned with each other in at least two different directions therebetween; and based on a positional relationship between at least part of an edge of said notch and said second alignment portion, said flexible printed circuit and said wiring board are aligned with each other in at least said two different directions therebetween.

13. A liquid crystal display device manufacturing method comprising:

a step of connecting a flexible printed circuit to said liquid crystal display panel, said flexible printed circuit comprising: a first circuit pattern formed on one face or two faces of an insulated flexible base film and a semiconductor device mounted at a predetermined region of said insulated flexible base film;

a step of interconnecting a wiring board to said flexible printed circuit, said wiring board comprising an insulated board on one face or two faces of which is formed a second circuit pattern for receiving a signal or transmitting it to said flexible printed circuit;

said step of interconnecting comprising the steps of:

forming part of said first circuit pattern formed on said insulated flexible base film so as to face said wiring board as a first alignment portion used in alignment of said flexible printed circuit and said wiring board;

forming part of said second circuit pattern formed on said insulated board as a second alignment portion used in alignment of said flexible printed circuit and said wiring board;

cutting said insulated flexible base film at a predetermined region thereof to form a notch through which said first alignment portion can be recognized visually; and said flexible printed circuit and said wiring board are aligned with each other at least in two different directions therebetween based on a positional relationship between said first alignment portion visually recognized through said notch and said second alignment portion; and wherein based on a positional relationship between at least part of an edge of said notch and said second alignment portion, said flexible printed circuit and said wiring board are aligned with each other in at least said two different directions therebetween.

* * * * *